US006972444B1

(12) United States Patent
Iacob

(10) Patent No.: US 6,972,444 B1
(45) Date of Patent: Dec. 6, 2005

(54) WAFER WITH SAW STREET GUIDE

(75) Inventor: Alin Theodor Iacob, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/635,363

(22) Filed: Aug. 6, 2003

(51) Int. Cl.[7] ............................................... H01L 27/10
(52) U.S. Cl. ...................... 257/202; 257/203; 257/208; 257/209; 257/210; 257/266
(58) Field of Search ............................... 257/202, 203, 257/204, 208, 209, 266, 291, 658, 210

(56) References Cited

U.S. PATENT DOCUMENTS 6,630,685 B1 * 10/2003 Lunde ......................... 257/48
6,799,976 B1 * 10/2004 Mok et al. ..................... 439/55
6,809,378 B2 * 10/2004 Byrd et al. ................. 257/347

* cited by examiner

*Primary Examiner*—Minhloan Tran

*Assistant Examiner*—Tan Tran

(74) *Attorney, Agent, or Firm*—Mark C. Pickering

(57) ABSTRACT

A wafer is formed with metal traces that extend a distance across the wafer on opposite sides of a saw street. The resistances of the metal traces, which can each be formed from one or more layers of metal, are measured before the saw street is cut. During and after the saw street is cut, the resistances of the metal traces are again measured, even continuously. The pre-cut, during-cut, and post-cut resistances are compared to determine if the wafer has been cut without damage to the wafer due to misalignment or a worn cutting device.

17 Claims, 14 Drawing Sheets

WAFER WITH SAW STREET GUIDE

DETAILED DESCRIPTION OF THE INVENTION

Figure 1:
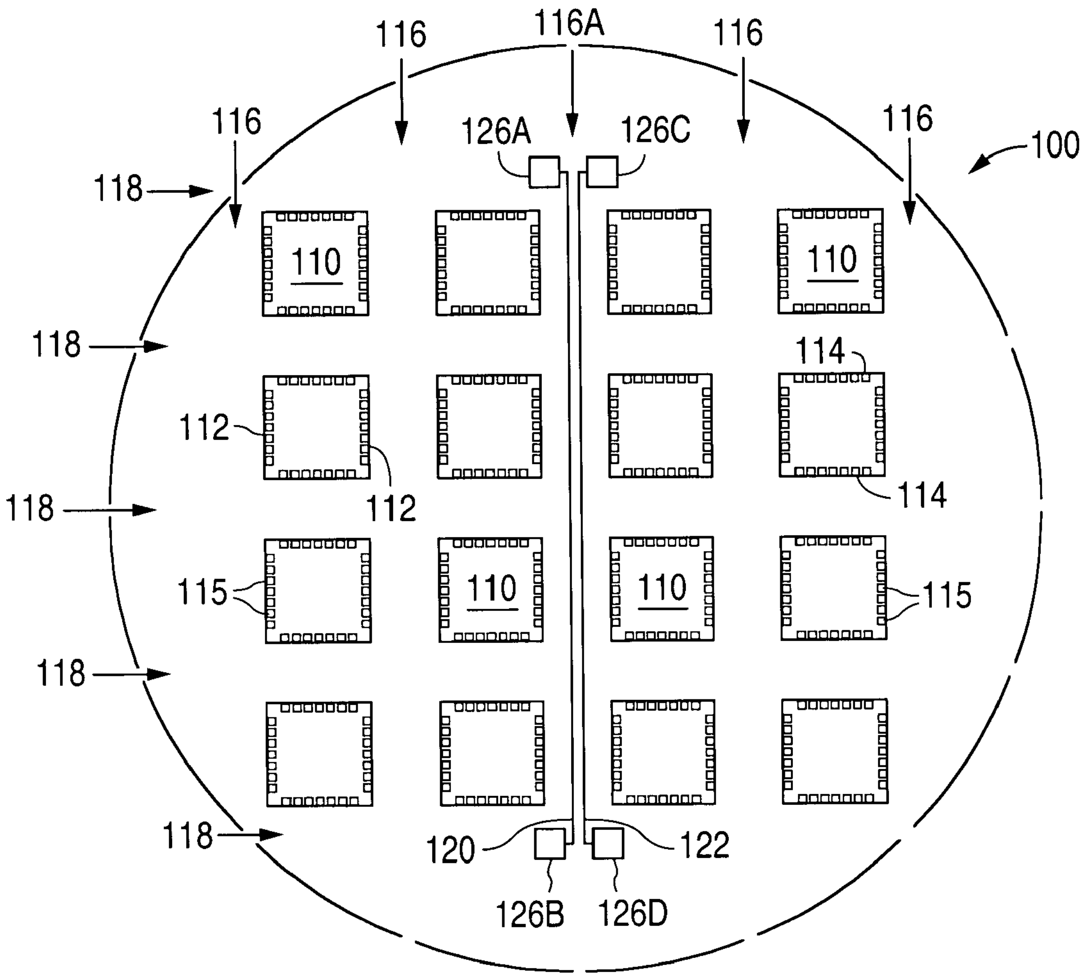
FIG. 1 is a plan view illustrating an example of a resistance sensing semiconductor wafer 100 in accordance with the present invention.

FIG. 1 shows a plan view that illustrates an example of a resistance sensing semiconductor wafer 100 in accordance with the present invention. As shown in FIG. 1, semiconductor wafer 100 includes a number of semiconductor circuits 110 that are formed in a square shape or a rectangular shape on wafer 100.

Each semiconductor circuit 110 has a pair of first sides 112 that are parallel to each other, and a pair of second sides 114 that are parallel to each other and perpendicular to the pair of first sides 112. The pairs of first and second sides 112 and 114, in turn, define the outer periphery of each of the circuits. In addition, each circuit 110 includes a number of metal pads 115 that are formed around the periphery of the circuit 110.

As further shown in FIG. 1, wafer 100 includes a number of first saw streets 116 that run parallel to the first sides 112 between a number of circuits 110, and between a number of circuits 110 and the edge of wafer 100. Wafer 100 additionally includes a number of second saw streets 118 that run parallel to the second sides 114 between a number of circuits 110, and between a number of circuits 110 and the edge of wafer 100. As shown, the first and second saw streets 116 and 118 are perpendicular to each other.

In accordance with the present invention, wafer 100 includes a resistance-measuring metal trace 120 and a resistance-measuring metal trace 122 that run parallel to each other along opposite sides of a saw street 116A across wafer 100. In addition, wafer 100 includes metal pads 126A and 126B that are connected to the ends of metal trace 120, and metal pads 126C and 126D that are connected to the ends of metal trace 122.

Figure 2:
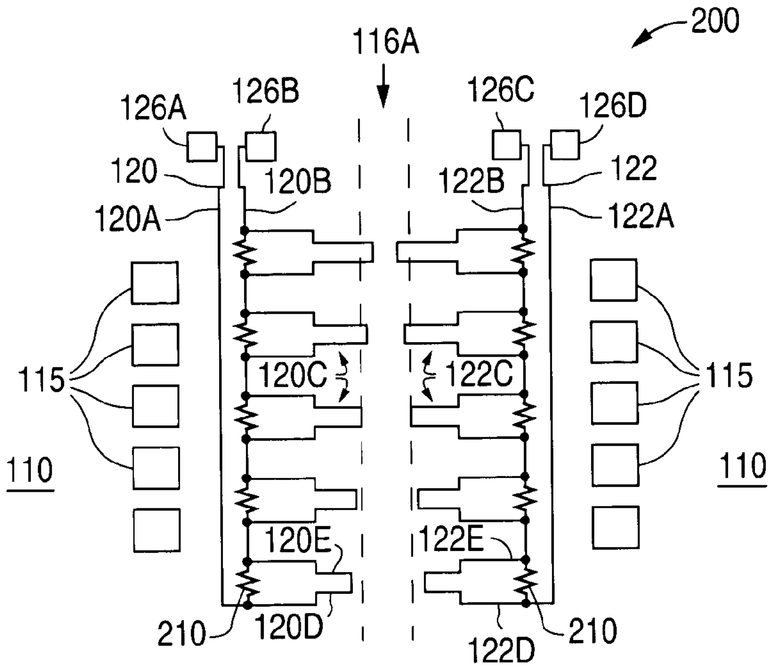
FIG. 2 is a plan view illustrating an example of an alternate embodiment of a resistance sensing semiconductor wafer 200 in accordance with the present invention.

FIG. 2 shows a plan view that illustrates an example of an alternate embodiment of a resistance sensing semiconductor wafer 200 in accordance with the present invention. Wafer 200 is similar to wafer 100 and, as a result, utilizes the same reference numerals to designate the structures that are common to both wafers.

As shown in FIG. 2, wafer 200 differs from wafer 100 in that metal trace 120 includes a first section 120A and a second section 120B that loops back along the same side of saw street 116A. In addition, second section 120B, which is closest to saw street 116A, includes a number of extension sections 120C that extend away from second section 120B towards saw street 116A.

Each extension section 120C includes a first leg 120D and a second leg 120E that are connected together at one end, and spaced apart and connected to the second section 120B at the other end. The extension sections 120C extend varying distances away from section 120B towards saw street 116A. In the FIG. 2 example, two of the extension sections 120C extend into saw street 116A.

In addition, the first and second sections 120A and 120B are formed adjacent to a circuit 110, but can extend further across wafer 200. If the first and second sections 120A and 120B extend further across wafer 200, the pattern shown in FIG. 2 can be repeated (longest extension section to shortest, longest extension section to shortest).

Similarly, wafer 200 differs from wafer 100 in that metal trace 122 includes a first section 122A and a second section 122B that loops back along the same side of saw street 116A. In addition, second section 122B, which is closest to saw street 116A, includes a number of extension sections 122C that extend away from second section 122B towards saw street 116A.

Each extension section 122C includes a first leg 122D and a second leg 122E that are connected together at one end, and spaced apart and connected to the second section 122B at the other end. The extension sections 122C extend varying distances away from section 122B towards saw street 116A. In the FIG. 2 example, two of the extension sections 122C extend into saw street 116A.

In addition, the first and second sections 122A and 122B are formed adjacent to a circuit 110, but can extend further across wafer 200. If the first and second sections 122A and 122B extend further across wafer 200, the pattern shown in FIG. 2 can be repeated (longest extension section to shortest, longest extension section to shortest).

Wafer 200 also differs from wafer 100 in that wafer 200 includes a number of resistors 210 that are connected so that a resistor 210 is connected to sections of second section 120B and between the first and second legs 120D and 120E of each extension section 120C, and to sections of section 122B and between the first and second legs 122D and 122E of each extension section 122C. (The resistance-measuring metal trace structures can also be formed on both sides of wafer 200 between the same saw street.)

Figure 3:
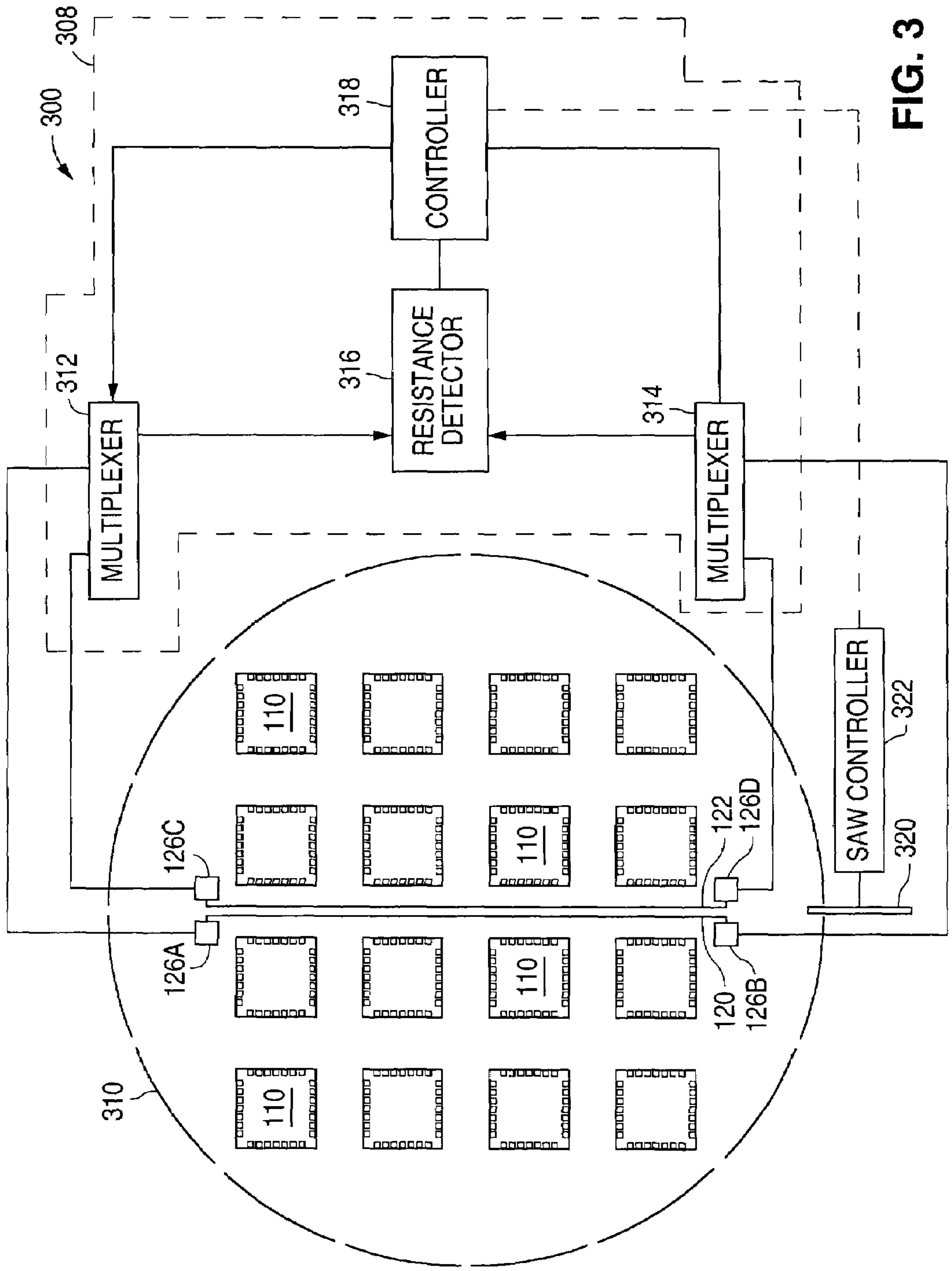
FIG. 3 is a block diagram illustrating an example of a wafer dicing system 300 in accordance with the present invention.

FIG. 3 shows a block diagram that illustrates an example of a wafer dicing system 300 in accordance with the present invention. As shown in FIG. 3, wafer dicing system 300 includes a resistance measuring system 308 that measures the resistances of the metal traces on a wafer 310. Wafer 310 is illustrated as wafer 100 and, as a result, utilizes the same reference numerals to designate the structures which are common to both wafers. Although wafer 310 is illustrated as wafer 100, wafer 310 can also be illustrated with wafer 200.

Resistance measuring system 308 includes a multiplexer 312 that is connected to metal pads 126A and 126C which are connected to the first ends of metal traces 120 and 122, and a multiplexer 314 that is connected to metal pads 126B and 126D which are connected to the second ends of metal traces 120 and 122. Resistance measuring system 308 also includes a resistance detector 316 that is connected to multiplexers 312 and 314.

As further shown in FIG. 3, wafer dicing system 300 additionally includes a system controller 318 that is connected to multiplexers 312 and 314, and resistance detector 316. Controller 318, in turn, controls multiplexers 312 and 314 and processes the resistance values measured by detector 316. When a problem is detected, controller 318 outputs a maintenance signal that indicates that maintenance is required.

In addition, a cutting device 320, such as a wafer saw or a laser, is utilized to cut wafer 310, and a saw controller 322 is utilized to control the alignment, linear speed, and rotational speed of cutting device 320. As shown by the dashed line, system controller 318 can be connected to saw controller 322.

Figure 4:
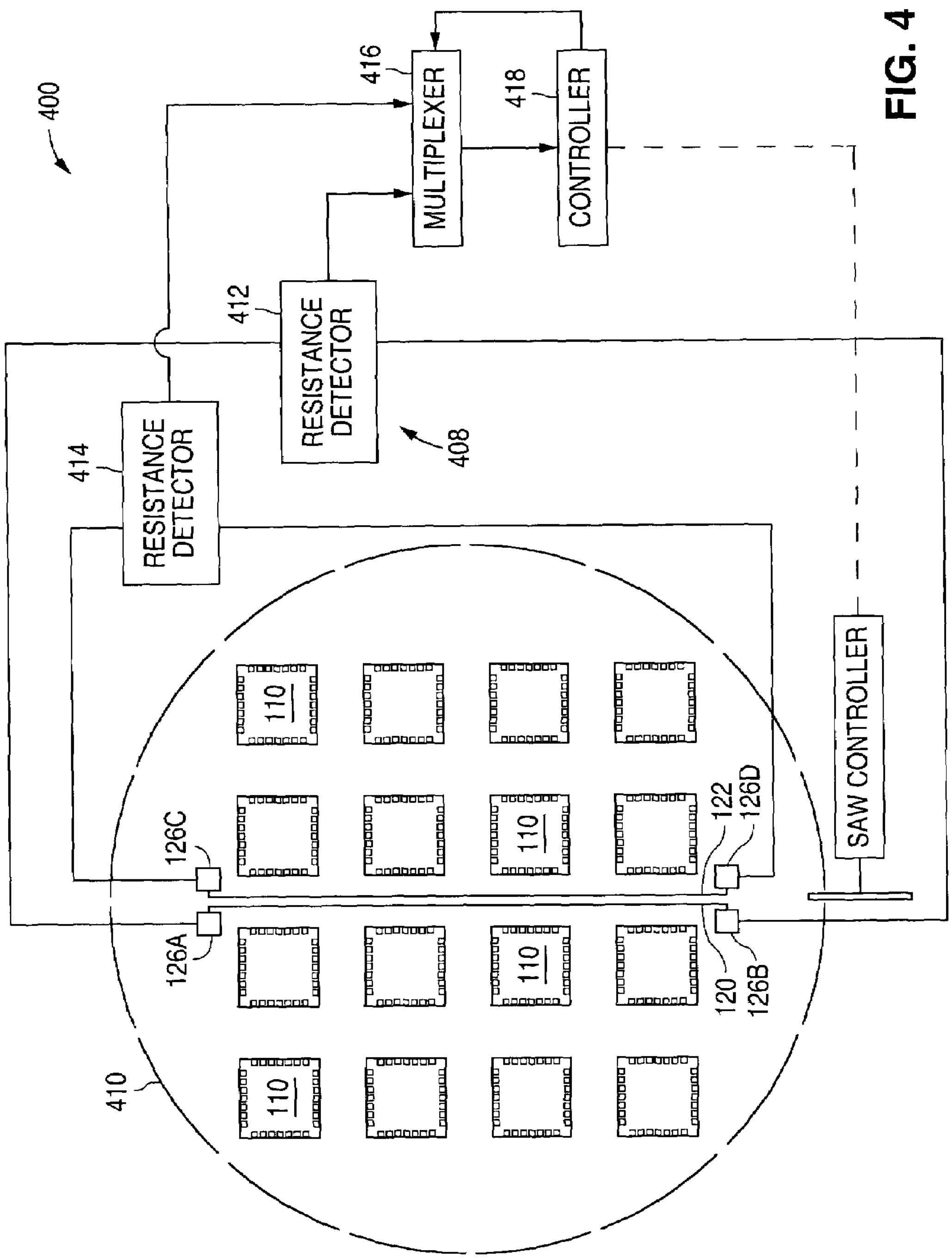
FIG. 4 is a block diagram illustrating an example of an alternate embodiment of a wafer dicing system 400 in accordance with the present invention.

FIG. 4 shows a block diagram that illustrates an example of an alternate embodiment of a wafer dicing system 400 in accordance with the present invention. As shown in FIG. 4, system 400 includes a resistance measuring system 408 that measures the resistances of the metal traces on a wafer 410. Wafer 410 is illustrated as wafer 100 and, as a result, utilizes the same reference numerals to designate the structures which are common to both wafers. Although wafer 410 is illustrated as wafer 100, wafer 410 can also be illustrated with wafer 200.

Resistance measuring system 408 includes a resistance detector 412 that is connected to metal pads 126A and 126B which are connected to the first and second ends of metal trace 120, and a resistance detector 414 that is connected to metal pads 126C and 126D which are connected to the first and second ends of metal trace 122.

As further shown in FIG. 4, wafer dicing system 400 additionally includes a multiplexer 416 that is connected to resistance detectors 412 and 414, and a system controller 418 that is connected to multiplexer 416. Controller 418, in turn, controls multiplexer 418 and processes the resistance values measured by detectors 412 and 414. When a problem is detected, controller 418 outputs a maintenance signal that indicates that maintenance is required. (Multiplexer 416 can alternately be part of controller 418 such that controller 418 receives signals directly from detectors 412 and 414.)

In addition, a cutting device 420, such as a wafer saw or a laser, is utilized to cut wafer 410, and a saw controller 422 is utilized to control the alignment, linear speed, and rotational speed of cutting device 420. As shown by the dashed line, system controller 418 can be connected to saw controller 422.

Figure 5:
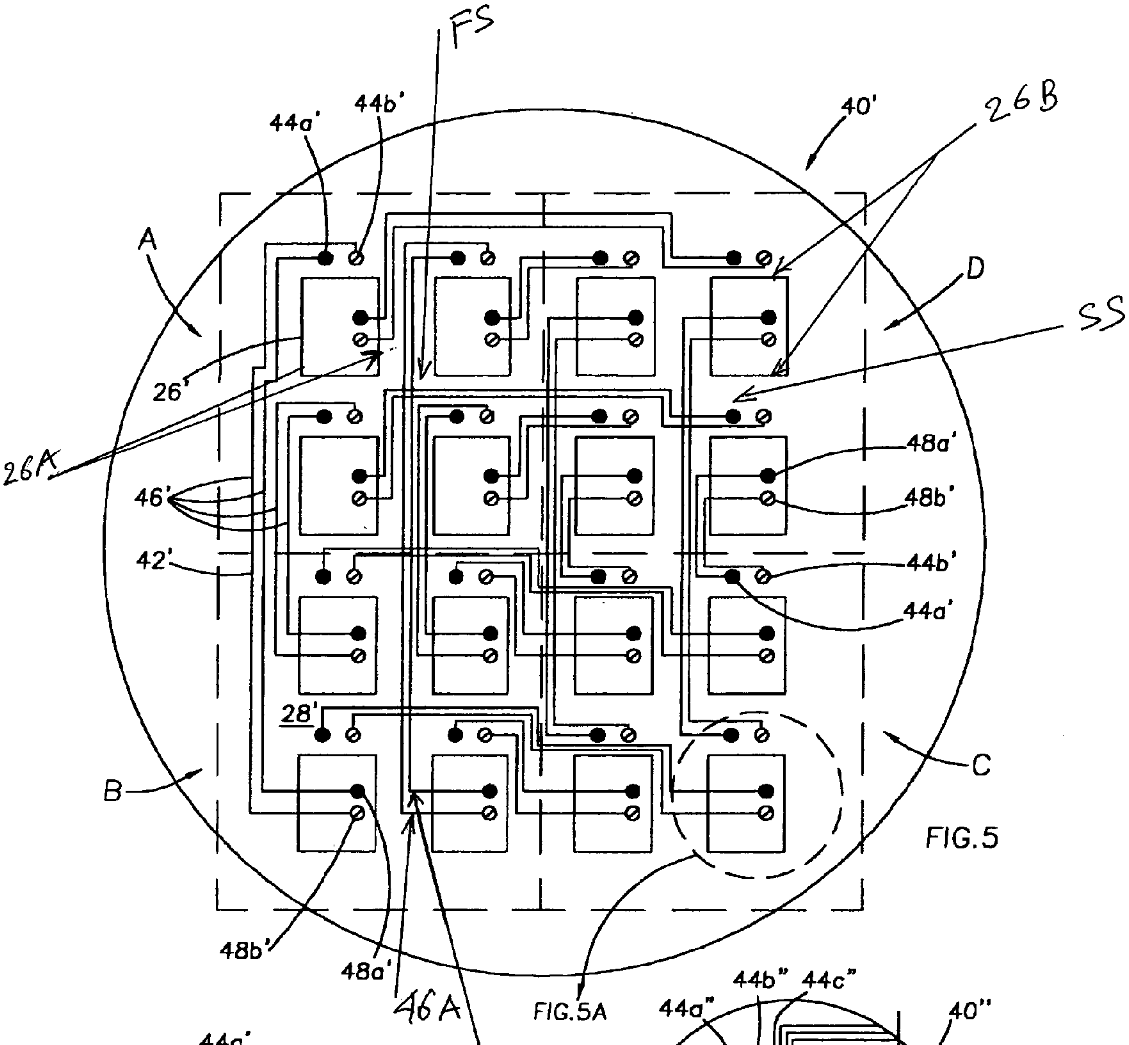
FIG. 5 is a flow chart illustrating an example of a method 500 of cutting a wafer in accordance with the present invention.
Figure 5A:
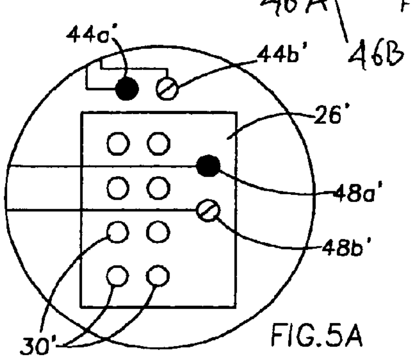
Figure 5B:
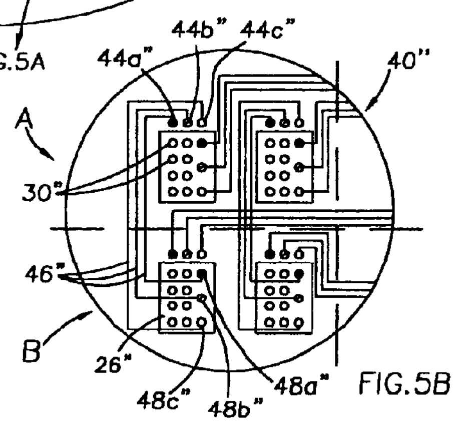

FIG. 5 shows a flow chart that illustrates an example of a method 500 of cutting a wafer in accordance with the present invention. As shown in FIG. 5, method 500 begins at step 510 by measuring and storing the resistance of a first metal trace. For example, controller 318 can command multiplexers 312 and 314 to connect metal trace 120 to resistance detector 316. Detector 316 detects the resistance of metal trace 120, and then controller 318 reads and stores the resistance detected by detector 316.

Alternately, controller 418 can command multiplexer 416 to connect resistance detector 412, which is connected to metal trace 120, to controller 418. Detector 412 detects the resistance of metal trace 120, and then controller 418 reads and stores the resistance detected by detector 412.

The resistance detectors of systems 300 and 400 can detect the resistance of the metal traces in a conventional manner. For example, the resistance detectors can cause a constant current to flow through the metal trace, and then measure the voltage difference across the ends of the metal trace.

After the resistance of the first metal trace has been measured and stored, method 500 moves to step 512 to measure and store the resistance of a second metal trace. For example, controller 318 can command multiplexers 312 and 314 to connect metal trace 122 to resistance detector 316. Detector 316 detects the resistance of metal trace 122, and then controller 318 reads and stores the resistance detected by detector 316.

Alternately, controller 418 can command multiplexer 416 to connect resistance detector 414, which is connected to metal trace 122, to controller 418. Detector 414 detects the resistance of metal trace 122, and then controller 418 reads and stores the resistance detected by detector 414.

Once the resistance of the second metal trace has been measured and stored, method 500 moves to step 514 to cut the wafer along the saw street that lies between the first and second metal traces, such as metal traces 120 and 122. Following this, method 500 moves to step 516 to again measure and store the resistance of the first metal trace.

Next, method 500 moves to step 518 to measure and store the resistance of the second metal trace. After the resistance of the second metal trace has been measured and stored a second time, method 500 moves to step 520 to determine if the resistance of the first metal trace has changed (more than an error tolerance), and if the resistance of the second metal trace has changed (more than an error tolerance).

If the saw that is used to cut the wafer is misaligned, the cut will not follow the saw street exactly and will remove part of one of the metal traces that lie on opposite sides of the saw street that was cut. Similarly, if the saw that is used to cut the wafer is worn and needs to be serviced or replaced; the cut will remove part of the metal traces that lie on opposite sides of the saw street that was cut.

When part of a metal trace has been removed, the resistance of the metal trace changes. The change in resistance (if greater than an error tolerance) indicates that the saw is misaligned or worn. Thus, by measuring the resistances of the metal traces before and after the cut, the alignment and condition of the saw can be monitored. When a problem is detected, the method outputs a maintenance signal that indicates that maintenance is required.

Saw misalignment as well as wear take place very gradually over a period of time. As a result, although only one pair of metal traces are utilized in wafers 100 and 200, if the wafer can be successfully cut without removing any portion of the metal traces, then there is a high likelihood that the remaining saw streets can be cut without damaging the circuits formed on the wafer.

In addition to detecting misalignment or wear, the present invention can also be used to align a new saw. In the FIG. 2 example, each resistor 210 is electrically shorted by an extension section 120C or 122C. Before the saw street is cut, the extension sections 120C and 122C are intact which, in turn, provides a low resistance path between contacts 126A and 126B, and between contacts 126C and 126D.

For example, assume that the resistance of metal traces 120 and 122 are each 10 Ω in the intact state. Such a low resistance can be achieved by using sufficiently thick and wide metal traces, and/or by using several metal layers. Many semiconductor manufacturing processes commonly use six or more metal layers.

After the saw street has been cut, some of the extension sections 120C and 122C will have been cut, and will cause the resistances of the metal traces to increase by the number of resistors 210 that are no longer shorted by the extension sections 120C and 122C. If each resistor 210 has a value of approximately 1 KΩ and the saw is perfectly aligned, then two extension sections 120C and two extension sections 122C will have been cut, increasing the resistance of metal traces 120 and 122 to approximately 2 KΩ each.

On the other hand, if the saw is misaligned, for example, three extension sections 120C of metal trace 120 can be cut while only one extension section 122C of metal trace 122 is cut. In this case, system controller 318 or 418 detects a resistance of approximately 3 KΩ in metal trace 120 and a resistance of approximately 1 KΩ in metal trace 122.

When used to align a new cutting device, such as a wafer saw, method 500 moves to step 522 where method 500 sends control signals to the saw controller to adjust the alignment of the cutting device. For example, system controller 318 and 418 can send control signals to saw controller 322 and 422, respectively, to adjust the alignment of cutting device 320 and 420, respectively. When the cutting device is properly aligned, the resistances of the metal traces 120 and 122 will be equal (within an error tolerance).

The alignment can be fine tuned in several ways. The resistance-measuring metal trace structures can be formed in multiple layers and the wafer can be cut multiple times at different depths. For example, the depth of the saw can be set to cut only through the top layer of metal. The saw is then aligned based on the change in resistance of a resistance-measuring metal trace structure formed from the top layer of metal.

Following this, the depth of the saw is set to cut only through the top metal layer and the next lower metal layer. The saw is then aligned based on the change in resistance of a resistance-measuring metal trace structure formed from the next lower metal layer. This process can then continue with deeper cuts until the alignment is fine tuned.

The resistance-measuring metal trace structures can also be formed along additional saw streets such that the alignment of the saw is further fine tuned as each new saw street is cut. Further, a number of wafers can be cut where the alignment of the saw is further fine tuned as a saw street is cut in each new wafer.

Figure 6:
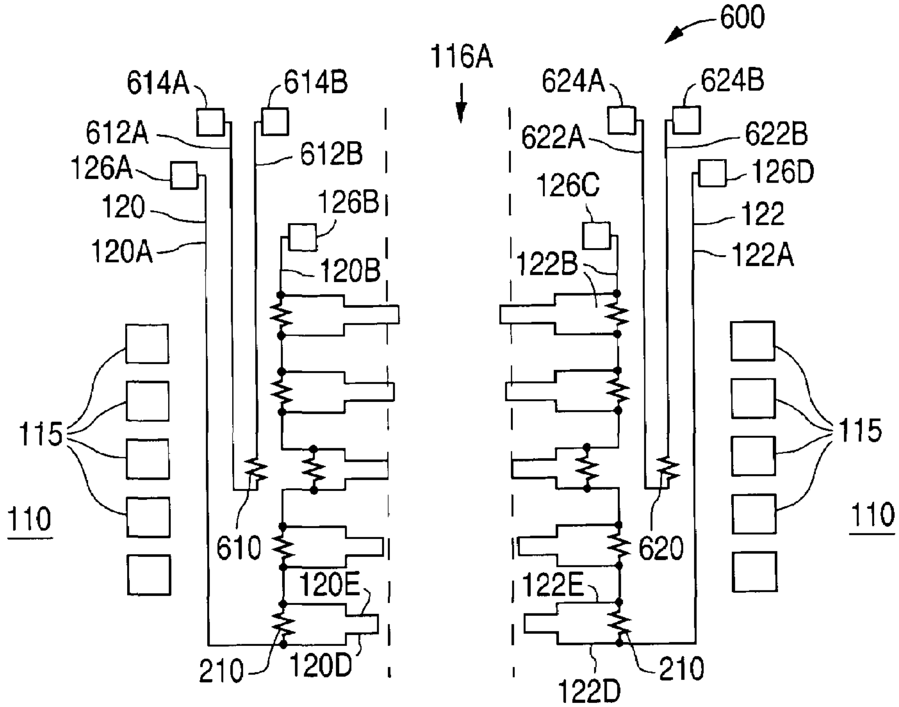
FIG. 6 is a plan view illustrating an example of a resistance sensing semiconductor wafer 600 in accordance with an alternate embodiment of the present invention.

FIG. 6 shows a plan view that illustrates an example of a resistance sensing semiconductor wafer 600 in accordance with an alternate embodiment of the present invention. Wafer 600 is similar to wafer 200 and, as a result, utilizes the same reference numerals to designate the structures that are common to both wafers.

As shown in FIG. 6, wafer 600 differs from wafer 200 in that wafer 600 includes a reference resistor 610 that is formed adjacent to metal trace 120, a metal trace 612A that is connected to one end of resistor 610, and a metal trace 612B that is connected to the opposite end of resistor 610. Further, wafer 600 includes a metal pad 614A that is connected to metal trace 612A and a metal pad 614B that is connected to metal trace 612B.

Wafer 600 also differs from wafer 200 in that wafer 600 includes a reference resistor 620 that is formed adjacent to metal trace 122, a metal trace 622A that is connected to one end of resistor 620, and a metal trace 622B that is connected to the opposite end of resistor 620. Further, wafer 600 includes a metal pad 624A that is connected to metal trace 622A and a metal pad 624B that is connected to metal trace 622B.

Although wafer 600 requires additional contact pads, wafer 600 provides a more accurate measurement of resistance. For example, one method is to measure the ratio of the resistance of a metal trace, such as metal trace 120, versus the resistance of the reference resistor, such as reference resistor 610.

A constant current can be input into the metal traces, such as traces 120 and 612A, and the voltage developed across the resistors will be proportional with the resistance value. Using this approach, a number of resistors, such as 5 to 15 resistors, can be connected in series, thus providing 5 to 15 saw displacement positions. (As with wafer 200, the resistance-measuring metal trace structures can be formed on both sides of wafer 600 between the same saw street.)

Figure 7B:
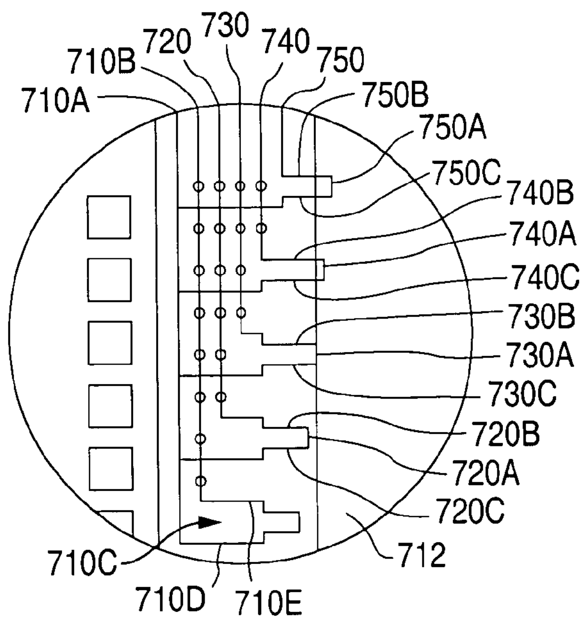
FIGS. 7A and 7B are plan views illustrating an example of a resistance sensing semiconductor wafer 700 in accordance with an alternate embodiment of the present invention.
Figure 7A:
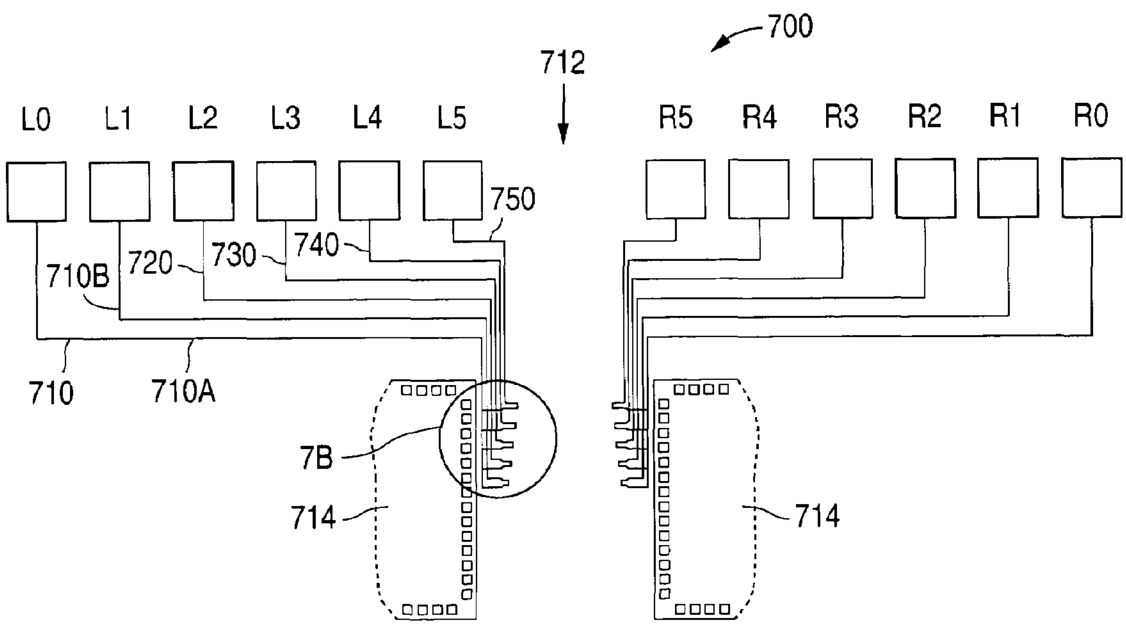

FIGS. 7A and 7B both show plan views that illustrate an example of a resistance sensing semiconductor wafer 700 in accordance with an alternate embodiment of the present invention. Wafer 700 is similar to wafer 200, except that wafer 700 utilizes individual metal traces to form each extension section.

As shown in FIGS. 7A and 7B, wafer 700 includes a first metal trace 710 that includes a first section 710A and a second section 710B that loops back along the same side of a saw street 712 that runs between adjacent circuits 714. In addition, metal trace 710 includes an extension section 710C that extends away toward saw street 712.

Extension section 710C includes a first leg 710D that is connected to first section 710A and a second leg 710E that is connected to second section 710B and to first leg 710D. In addition, a pad L0 is connected to first section 710A and a second pad L1 is connected to second section 710B.

Wafer 700 also includes a second metal trace 720 and an extension section 720A that extends away toward saw street 712. Extension section 720A includes a first leg 720B that is connected to trace 720 and a second leg 720C that is connected to first section 710A and first leg 720B. Further, a pad L2 is connected to metal trace 720.

In addition, wafer 700 includes a third metal trace 730 and an extension section 730A that extends away toward saw street 712. Extension section 730A includes a first leg 730B that is connected to metal trace 730 and a second leg 730C that is connected to first section 710A and first leg 730B. Further, a pad L3 is connected to metal trace 730.

Wafer 700 further includes a fourth metal trace 740 and an extension section 740A that extends away toward saw street 712. Extension section 740A includes a first leg 740B that is connected to metal trace 740 and a second leg 740C that is connected to first section 710A and first leg 740B. Further, a pad L4 is connected to metal trace 740.

Wafer 700 additionally includes a fifth metal trace 750 and an extension section 750A that extends away toward saw street 712. Extension section 750A includes a first leg 750B that is connected to metal trace 750 and a second leg 750C that is connected to first section 710A and first leg 750B. Further, a pad L5 is connected to metal trace 750.

As shown in FIGS. 7A and 7B, this same structure is repeated on the opposite side of saw street 712. In operation, the resistance of metal trace 710 is measured by measuring the resistance across pads L0 and L1, while the resistance of metal trace 720 is measured by measuring the resistance across pads L0 and L2.

Similarly, the resistance of metal trace 730 is measured by measuring the resistance across pads L0 and L3, the resistance of metal trace 740 is measured by measuring the resistance across pads L0 and L4, and the resistance of metal trace 750 is measured by measuring the resistance across pads L0 and L5. The same process is used to measure the resistance of the metal traces that lie on the opposite side of saw street 712. (As with wafer 200, the resistance-measuring metal trace structures can be formed on both sides of wafer 700 between the same saw street.)

Figure 8:
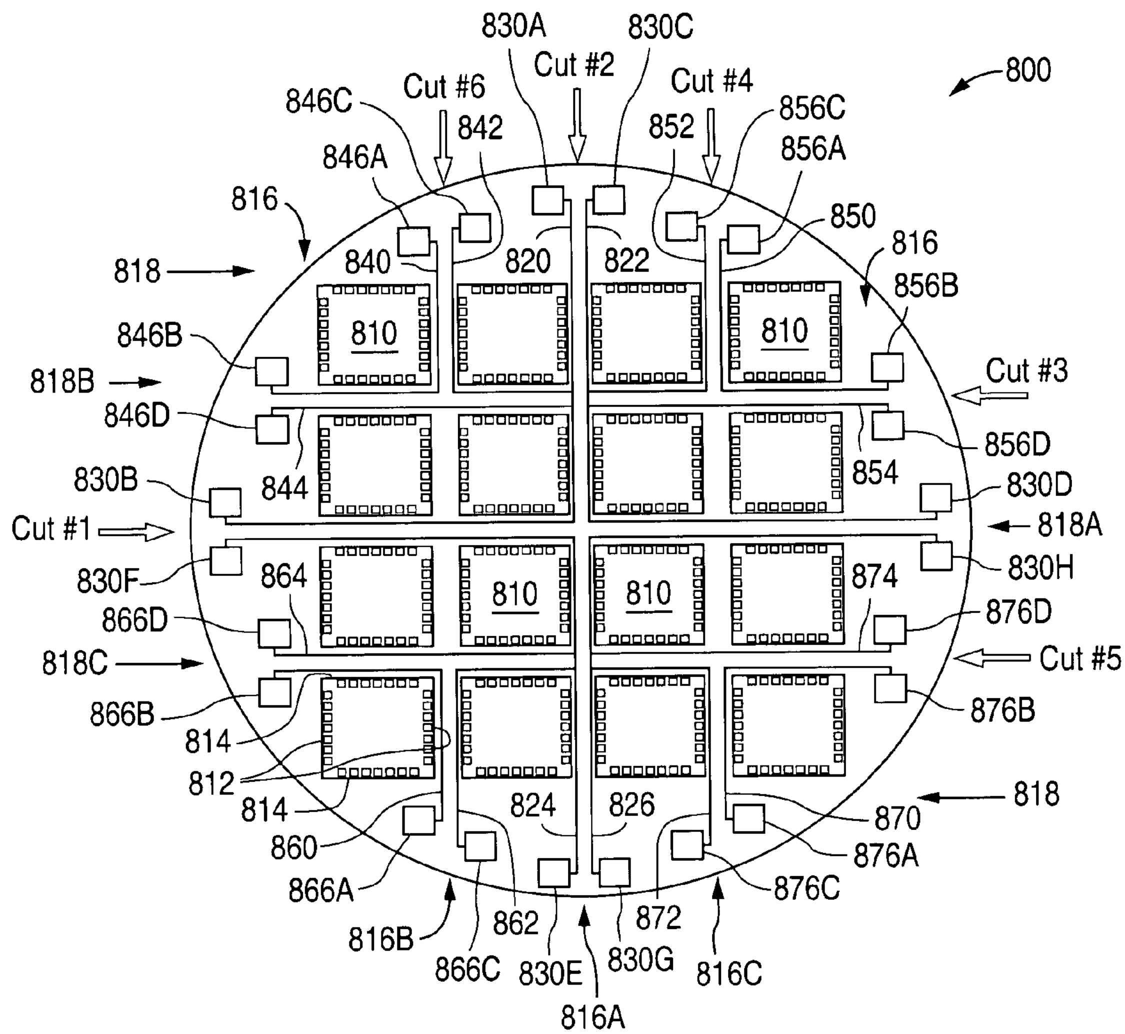
FIG. 8 is a plan view illustrating an example of a resistance sensing semiconductor wafer 800 in accordance with an alternate embodiment of the present invention.

FIG. 8 shows a plan view that illustrates an example of a resistance sensing semiconductor wafer 800 in accordance with the present invention. As shown in FIG. 8, semiconductor wafer 800 includes a number of semiconductor circuits 810 that are formed in a square shape or a rectangular shape on wafer 800.

Each semiconductor circuit 810 has a pair of first sides 812 that are parallel to each other, and a pair of second sides 814 that are parallel to each other and perpendicular to the pair of first sides 812. The pairs of first and second sides 812 and 814, in turn, define the outer periphery of the circuit.

As further shown in FIG. 8, wafer 800 also includes a number of first saw streets 816 that run parallel to the first sides 812 between a number of circuits 810, and between a number of circuits 810 and the edge of wafer 800. Wafer 800 additionally includes a number of second saw streets 818 that run parallel to the second sides 814 between a number of circuits 810, and between a number of circuits 810 and the edge of wafer 800. As shown, the first and second saw streets 816 and 818 are perpendicular to each other.

In accordance with the present invention, wafer 800 includes a metal trace 820 that runs parallel to a saw street 816A and then turns and runs parallel to a saw street 818A. Wafer 800 also includes a metal trace 822 that runs parallel to metal trace 820 along the opposite side of saw street 816A and then turns and runs parallel to saw street 818A in the opposite direction as metal trace 820.

In addition, wafer 800 includes a metal trace 824 that runs parallel to saw street 816A and then turns and runs parallel to metal trace 820 along the opposite side of saw street 818A. Wafer 800 further includes a metal trace 826 that runs parallel to metal trace 824 along the opposite side of saw street 816A and then turns and runs parallel to metal trace 822 along the opposite side of saw street 818A.

In addition, wafer 800 includes metal pads 830A and 830B that are connected to the first and second ends of metal trace 820, and metal pads 830C and 830D that are connected to the first and second ends of metal trace 822. Further, wafer 800 includes metal pads 830E and 830F that are connected to the first and second ends of metal trace 824, and metal pads 830G and 830H that are connected to the first and second ends of metal trace 826.

As further shown in FIG. 8, wafer 800 includes a metal trace 840 that runs parallel to a saw street 816B and then turns and runs parallel to a saw street 818B. Wafer 800 also includes a metal trace 842 that runs parallel to metal trace 840 along the opposite side of saw street 816B and then turns and runs parallel to saw street 818B in the opposite direction as metal trace 840, terminating at metal trace 820. Wafer 800 includes a metal trace 844 that runs parallel to portions of metal traces 840 and 842 along the opposite side of saw street 818B, terminating at metal trace 820.

Further, wafer 800 includes metal pads 846A and 846B that are connected to the first and second ends of metal trace 840, a metal pad 846C that is connected to the unconnected end of metal trace 842, and a metal pad 846D that is connected to the unconnected end of metal trace 844.

In addition, wafer 800 includes a metal trace 850 that runs parallel to a saw street 816C and then turns and runs parallel to saw street 818B. Wafer 800 includes a metal trace 852 that runs parallel to metal trace 850 along the opposite side of saw street 816C and then turns and runs parallel to saw street 818B in the opposite direction as metal trace 850, terminating at metal trace 822. Wafer 800 includes a metal trace 854 that runs parallel to portions of metal traces 850 and 852 along the opposite side of saw street 818B, terminating at metal trace 822.

Further, wafer 800 includes metal pads 856A and 856B that are connected to the first and second ends of metal trace 850, a metal pad 856C that is connected to the unconnected end of metal trace 852, and a metal pad 856D that is connected to the unconnected end of metal trace 854.

Further, wafer 800 includes a metal trace 860 that runs parallel to saw street 816B and then turns and runs parallel to a saw street 818C. Wafer 800 includes a metal trace 862 that runs parallel to metal trace 860 along the opposite side of saw street 816B and then turns and runs parallel to saw street 818C in the opposite direction as metal trace 860, terminating at metal trace 824. Wafer 800 includes a metal trace 864 that runs parallel to portions of metal traces 860 and 862 along the opposite side of saw street 818C, terminating at metal trace 824.

Further, wafer 800 includes metal pads 866A and 866B that are connected to the first and second ends of metal trace 860, a metal pad 866C that is connected to the unconnected end of metal trace 862, and a metal pad 866D that is connected to the unconnected end of metal trace 864.

Wafer 800 also includes a metal trace 870 that runs parallel to saw street 816C and then turns and runs parallel to saw street 818C. Wafer 800 includes a metal trace 872 that runs parallel to metal trace 870 along the opposite side of saw street 816C and then turns and runs parallel to saw street 818C in the opposite direction as metal trace 870, terminating at metal trace 826. Wafer 800 includes a metal trace 874 that runs parallel to portions of metal traces 870 and 872 along the opposite side of saw street 818C, terminating at metal trace 826.

Further, wafer 800 includes metal pads 876A and 876B that are connected to the first and second ends of metal trace 870, a metal pad 876C that is connected to the unconnected end of metal trace 872, and a metal pad 876D that is connected to the unconnected end of metal trace 874. (Although wafer 800 is shown with a number of metal traces, wafer 800 can alternately be formed with fewer metal traces, such as only traces 820, 822, 824, and 826.)

Figure 9:
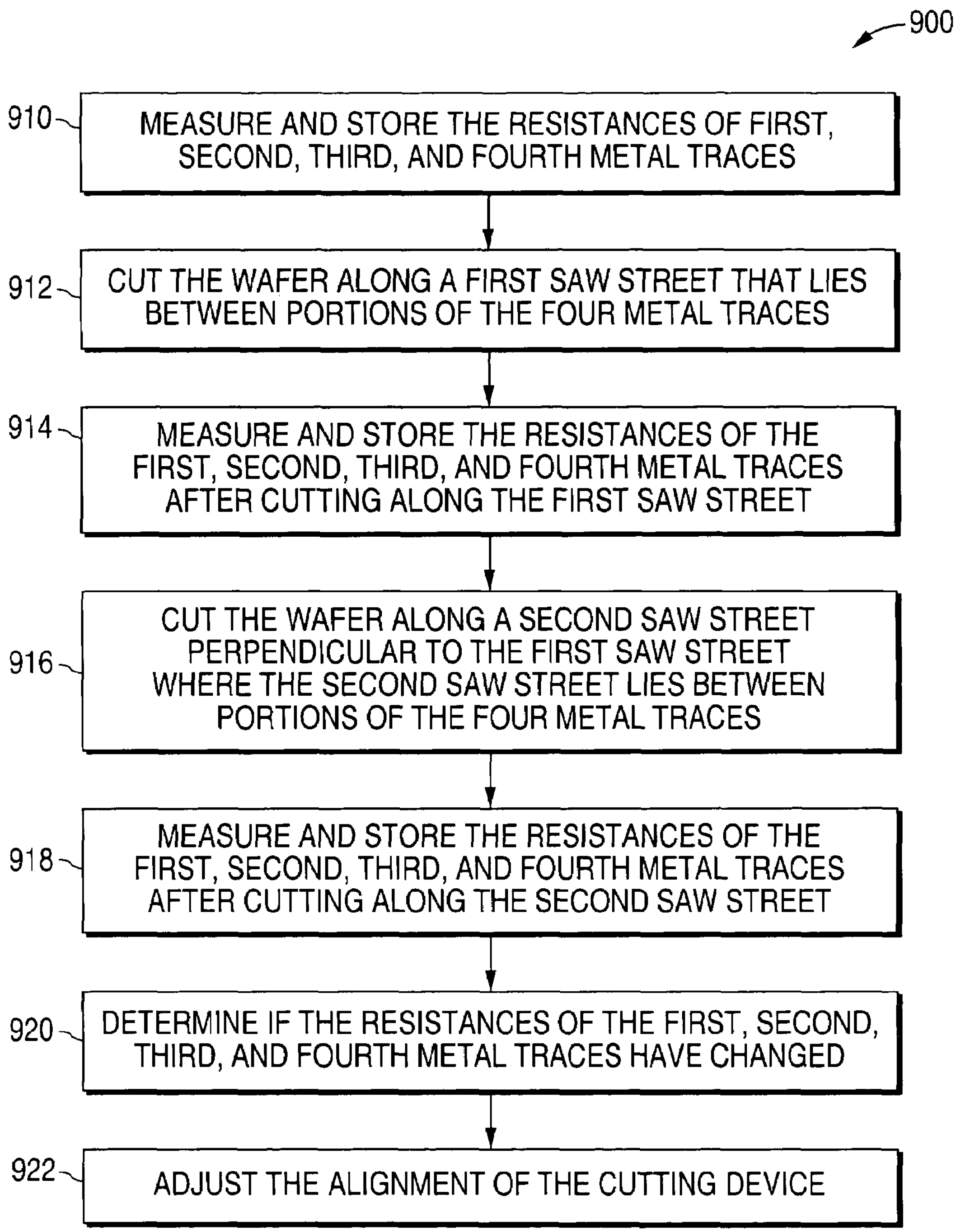
FIG. 9 is a flow chart illustrating an example of a method 900 of cutting a wafer in accordance with the present invention.

FIG. 9 shows a flow chart that illustrates an example of a method 900 of cutting a wafer in accordance with the present invention. As shown in FIG. 9, method 900 begins at step 910 by measuring and storing the resistances of first, second, third, and fourth metal traces, such as metal traces 820, 822, 824, and 826.

The resistances of the four metal traces can be measured by modifying system 300 to include additional inputs to the multiplexers 312 and 314, or by modifying system 400 to include additional resistance detectors and additional inputs to multiplexer 416. For example, controller 318 can command multiplexers 312 and 314 to sequentially connect metal traces 820, 822, 824, and 826 to resistance detector 316. Detector 316 detects the resistance of each metal trace 820, 822, 824, and 826, and then controller 318 reads and stores the resistances detected by detector 316.

After the resistances of the four metal traces have been measured and stored, method 900 moves to step 912 to cut the wafer along a first saw street that lies between portions of the four metal traces, such as saw street 818A. Following this, method 900 moves to step 914 to again measure and store the resistances of the first, second, third, and fourth metal traces.

Next, method 900 moves to step 916 to cut the wafer along a second saw street, which is perpendicular to the first saw street and lies between portions of the four metal traces, such as saw street 816A. Following this, method 900 moves to step 918 to again measure and store the resistances of the first, second, third, and fourth metal traces. After this, method 900 moves to step 920 to determine if the resistances of the first, second, third, and fourth metal traces have changed (more than an error tolerance). When a problem is detected, the method outputs a maintenance signal that indicates that maintenance is required.

As above with method 500, method 900 can also be used to adjust the alignment of the cutting device. When used to align a new cutting device, such as a wafer saw, method 900 moves to step 922 where method 900 sends control signals to the saw controller to adjust the alignment of the cutting device. When the cutting device is properly aligned, the resistances of the metal traces will be equal (within an error tolerance).

In addition to making two perpendicular cuts, the resistances of the additional metal traces, such as traces 840, 842, 844, 850, 852, 854, 860, 862, 864, 870, 872, and 874 can also be measured and saved prior to and after cutting the saw streets that lie between these metal traces. The addition cuts are made, as illustrated in FIG. 8, by cutting from the center outwards. Further, a determination of whether the resistances have changed can also be made after the first saw street has been cut and the second saw street has been cut.

Figure 10:
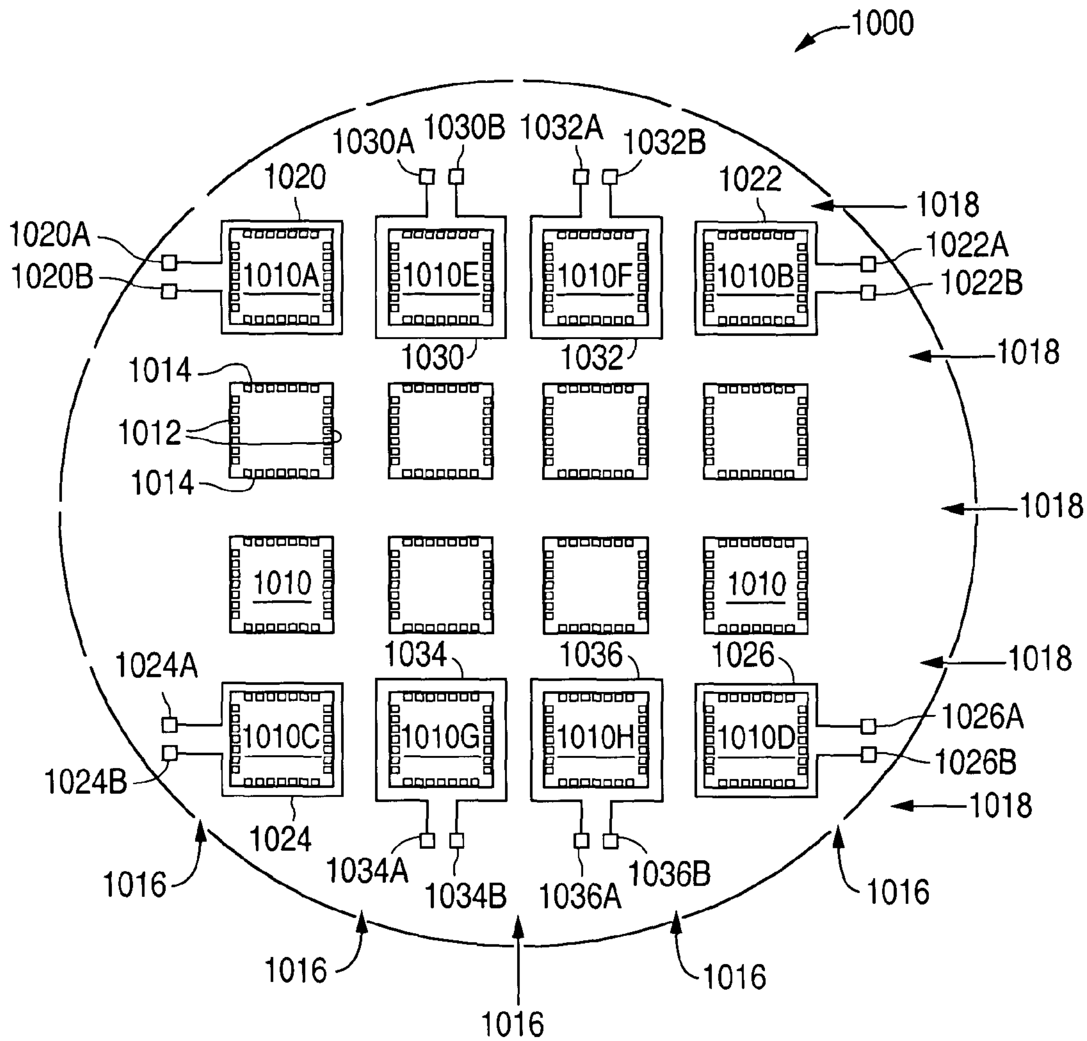
FIG. 10 is a plan view illustrating an example of a resistance sensing semiconductor wafer 1000 in accordance with the present invention.

FIG. 10 shows a plan view that illustrates an example of a resistance sensing semiconductor wafer 1000 in accordance with the present invention. As shown in FIG. 10, semiconductor wafer 1000 includes a number of semiconductor circuits 1010 that are formed in a square shape or a rectangular shape on wafer 1000.

Each semiconductor circuit 1010 has a pair of first sides 1012 that are parallel to each other, and a pair of second sides 1014 that are parallel to each other and perpendicular to the pair of first sides 1012. The pairs of first and second sides 1012 and 1014, in turn, define the outer periphery of the circuit.

As further shown in FIG. 10, wafer 1000 also includes a number of first saw streets 1016 that run parallel to the first sides 1012 between a number of circuits 1010, and between a number of circuits 1010 and the edge of wafer 1000. Wafer 1000 additionally includes a number of second saw streets 1018 that run parallel to the second sides 1014 between a number of circuits 1010, and between a number of circuits 1010 and the edge of wafer 1000. As shown, the first and second saw streets 1016 and 1018 are perpendicular to each other.

In accordance with the present invention, wafer 1000 includes a metal trace 1020 that runs around the periphery of a circuit 1010A that sits in a first corner of wafer 1000, and a metal trace 1022 that runs around the periphery of a circuit 1010B that sits in a second corner of wafer 1000. Metal pads 1020A and 1020B are connected to the ends of metal trace 1020, and metal pads 1022A and 1022B are connected to the ends of metal trace 1022.

Wafer 1000 includes a metal trace 1024 that runs around the periphery of a circuit 1010C that sits in a third corner of wafer 1000, and a metal trace 1026 that runs around the periphery of a circuit 1010D that sits in a fourth corner of wafer 1000. Metal pads 1024A and 1024B are connected to the ends of metal trace 1024, and metal pads 1026A and 1026B are connected to the ends of metal trace 1026.

In addition, wafer 1000 includes a metal trace 1030 that runs around the periphery of a circuit 1010E that sits adjacent to circuit 1010A between circuits 1010A and 1010B, and a metal trace 1032 that runs around the periphery of a circuit 1010F that sits adjacent to circuit 1010B between circuits 1010A and 1010B. Metal pads 1030A and 1030B are connected to the ends of metal trace 1030, and metal pads 1032A and 1032B are connected to the ends of metal trace 1032.

Further, wafer 1000 includes a metal trace 1034 that runs around the periphery of a circuit 1010G that sits adjacent to circuit 1010C between circuits 1010C and 1010D, and a metal trace 1036 that runs around the periphery of a circuit 1010H that sits adjacent to circuit 1010D between circuits 1010C and 1010D. Metal pads 1034A and 1034B are connected to the ends of metal trace 1034, and metal pads 1036A and 1036B are connected to the ends of metal trace 1036.

Figure 11:
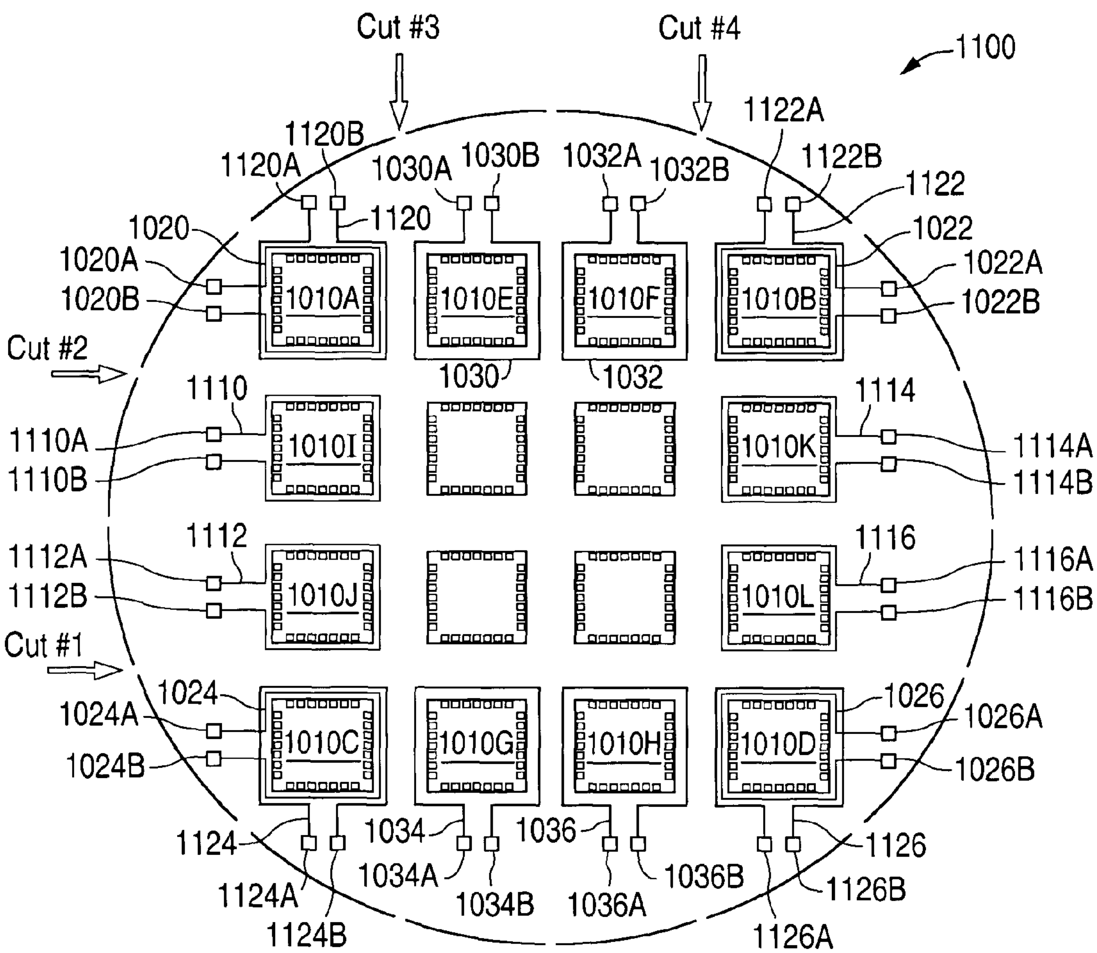
FIG. 11 is a plan view illustrating an example of a resistance sensing semiconductor wafer 1100 in accordance with an alternate embodiment of the present invention.

FIG. 11 shows a plan view that illustrates an example of a resistance sensing semiconductor wafer 1100 in accordance with an alternate embodiment of the present invention. Wafer 1100 is similar to wafer 1000 and, as a result, utilizes the same reference numerals to designate the structures that are common to both wafers.

Wafer 1100 differs from wafer 1000 in that wafer 1100 includes additional metal traces that allow additional cuts to be monitored. As shown in FIG. 11, wafer 1100 includes a metal trace 1110 that runs around the periphery of a circuit 1010I that sits adjacent to circuit 1010A between circuits 1010A and 1010C, and a metal trace 1112 that runs around the periphery of a circuit 10103 that sits adjacent to circuit 1010C between circuits 1010A and 1010C. Metal pads 1110A and 1110B are connected to the ends of metal trace 1110, and metal pads 1112A and 1112B are connected to the ends of metal trace 1112.

Further, wafer 1100 includes a metal trace 1114 that runs around the periphery of a circuit 1010K that sits adjacent to circuit 100B between circuits 1010B and 1010D, and a metal trace 1116 that runs around the periphery of a circuit 1010L that sits adjacent to circuit 1010D between circuits 1010B and 1010D. Metal pads 1114A and 1114B are connected to the ends of metal trace 1114, and metal pads 1116A and 1116B are connected to the ends of metal trace 1116.

In addition, wafer 1100 includes a metal trace 1120 that runs around the periphery of circuit 1010A, and a metal trace 1122 that runs around the periphery of circuit 1010B. Metal pads 1120A and 1120B are connected to the ends of metal trace 1120, and metal pads 1122A and 1122B are connected to the ends of metal trace 1122.

Wafer 1100 includes a metal trace 1124 that runs around the periphery of circuit 1010C, and a metal trace 1126 that runs around the periphery of circuit 1010D. Metal pads 1124A and 1124B are connected to the ends of metal trace 1124, and metal pads 1126A and 1126B are connected to the ends of metal trace 1126. In the FIG. 11 example, metal traces 1020, 1022, 1024, and 1026 are formed from one metal layer, while metal traces 1120, 1122, 1124, and 1126 are formed from a different metal layer. The underlying metal layers are contacted by vias that extend up to the top metal layer. One example of a cutting pattern is also illustrated in FIG. 11.

Figure 12:
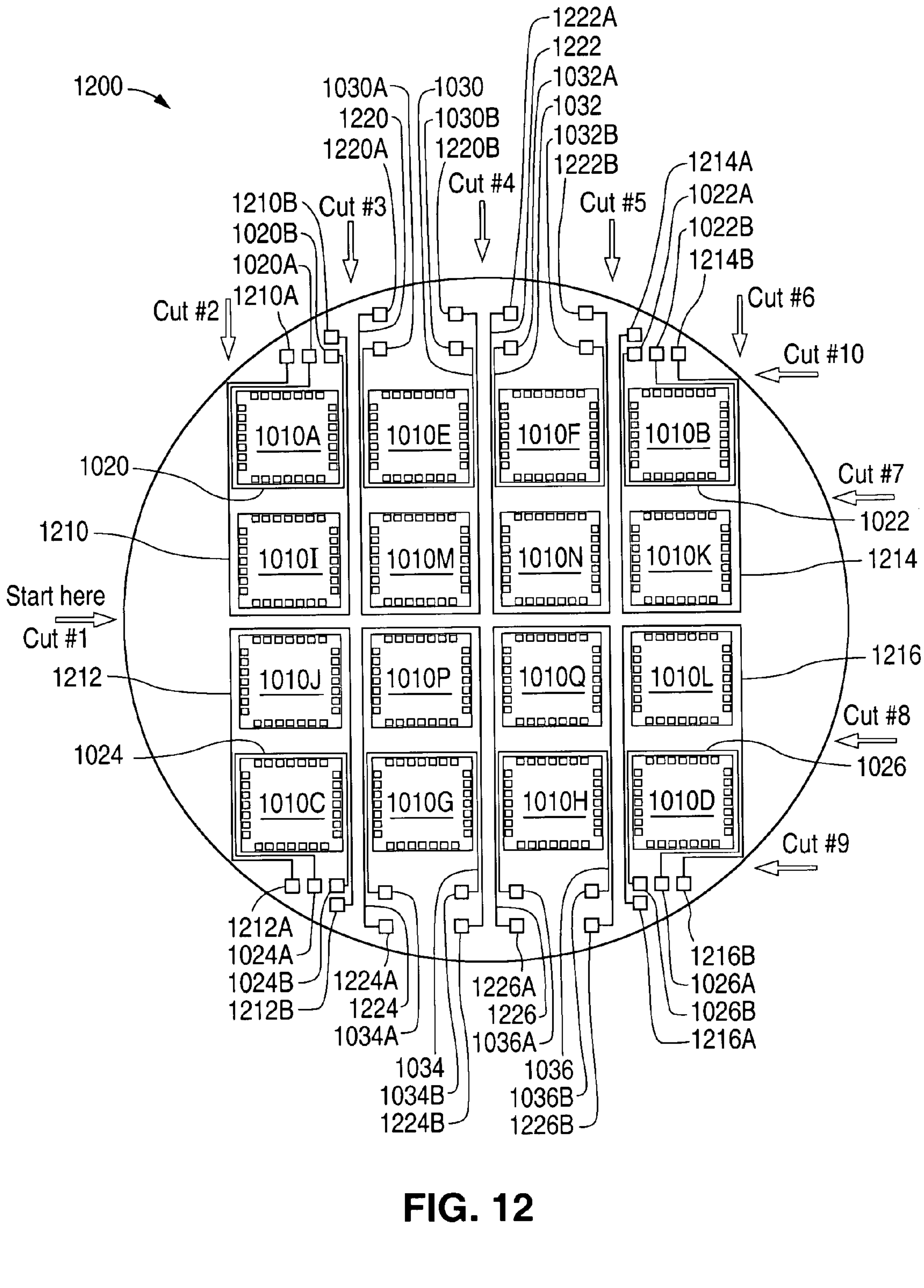
FIG. 12 is a plan view illustrating an example of a resistance sensing semiconductor wafer 1200 in accordance with an alternate embodiment of the present invention.

FIG. 12 shows a plan view that illustrates an example of a resistance sensing semiconductor wafer 1200 in accordance with an alternate embodiment of the present invention. Wafer 1200 is similar to wafer 1000 and, as a result, utilizes the same reference numerals to designate the structures that are common to both wafers.

Wafer 1200 differs from wafer 1000 in that wafer 1200 includes additional metal traces that allow additional cuts to be monitored. As shown in FIG. 12, wafer 1200 includes a metal trace 1210 that runs around the periphery of a combination of circuits 1010A and a circuit 1010I that sits adjacent to circuit 1010A between circuits 1010A and 1010C, and a metal trace 1212 that runs around the periphery of a combination of circuit 1010C and a circuit 1010J that sits adjacent to circuit 1010C between circuits 1010A and 110C. Metal pads 1210A and 1210B are connected to the ends of metal trace 1210, and metal pads 1212A and 1212B are connected to the ends of metal trace 1212.

Further, wafer 1200 includes a metal trace 1214 that runs around the periphery of a combination of circuit 1010B and a circuit 1010K that sits adjacent to circuit 1010B between circuits 1010B and 1010D, and a metal trace 1216 that runs around the periphery of a combination of circuit 1010D and a circuit 1010L that sits adjacent to circuit 1010D between circuits 1010B and 1010D. Metal pads 1214A and 1214B are connected to the ends of metal trace 1214, and metal pads 1216A and 1216B are connected to the ends of metal trace 1216.

In addition, wafer 1200 includes a metal trace 1220 that runs around the periphery of a combination of circuit 1010E and a circuit 1010M that sits adjacent to circuit 1010E between circuits 1010E and 1010G, and a metal trace 1222 that runs around the periphery of a combination of circuit 1010F and a circuit 1010N that sits adjacent to circuit 1010F between circuits 1010F and 1010H. Metal pads 1220A and 1220B are connected to the ends of metal trace 1220, and metal pads 1222A and 1222B are connected to the ends of metal trace 1222.

Further, wafer 1200 includes a metal trace 1224 that runs around the periphery of a combination of circuit 1010G and a circuit 1010P that sits adjacent to circuit 1010G between circuits 1010E and 1010G, and a metal trace 1226 that runs around the periphery of a combination of circuit 1010H and a circuit 1010Q that sits adjacent to circuit 1010H between circuits 1010F and 1010H. Metal pads 1224A and 1224B are connected to the ends of metal trace 1224, and metal pads 1226A and 1226B are connected to the ends of metal trace 1226.

Figure 13A:
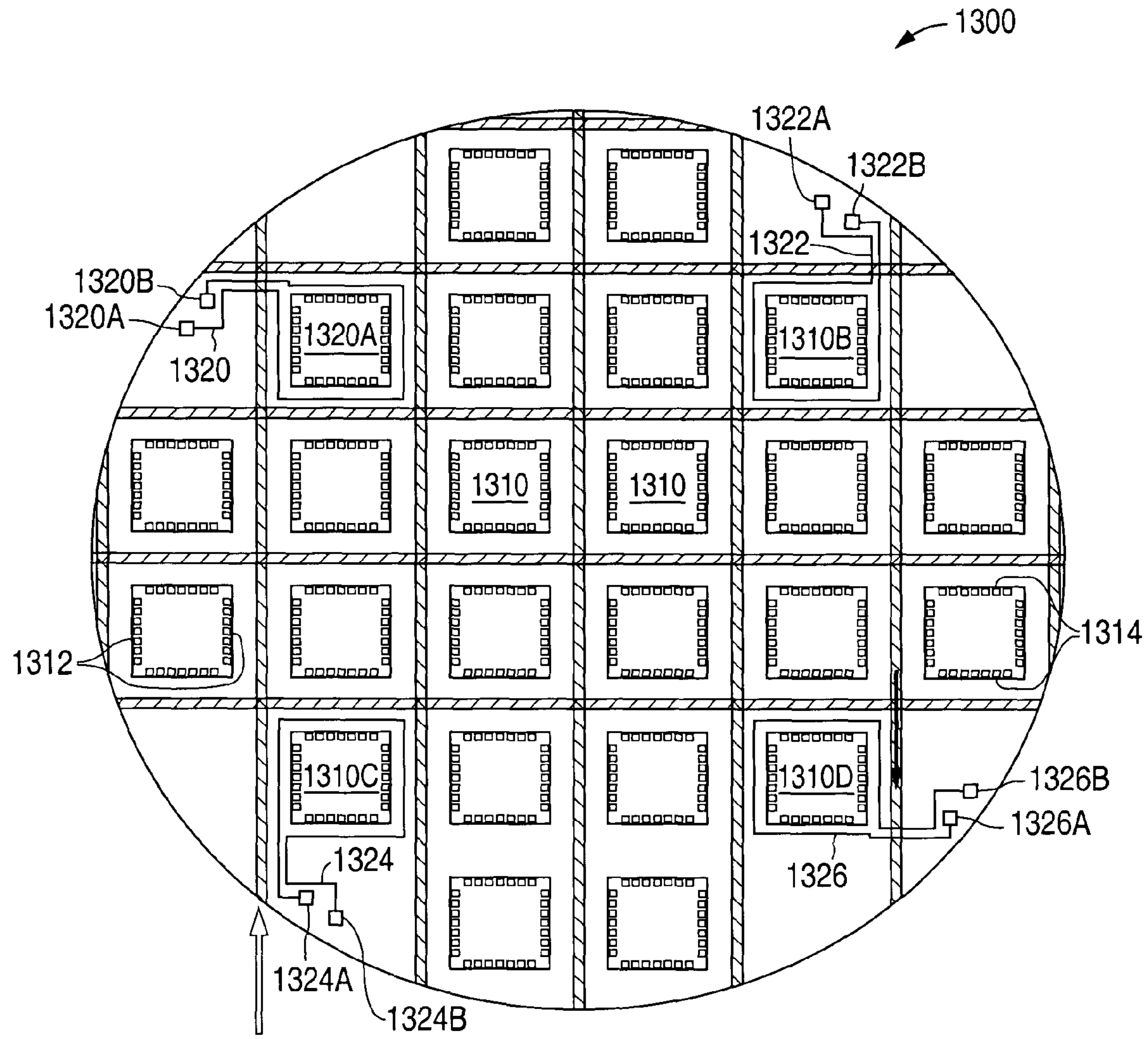
FIGS. 13A and 13B are plan views illustrating an example of a resistance sensing semiconductor wafer 1300 in accordance with the present invention.
Figure 13B:
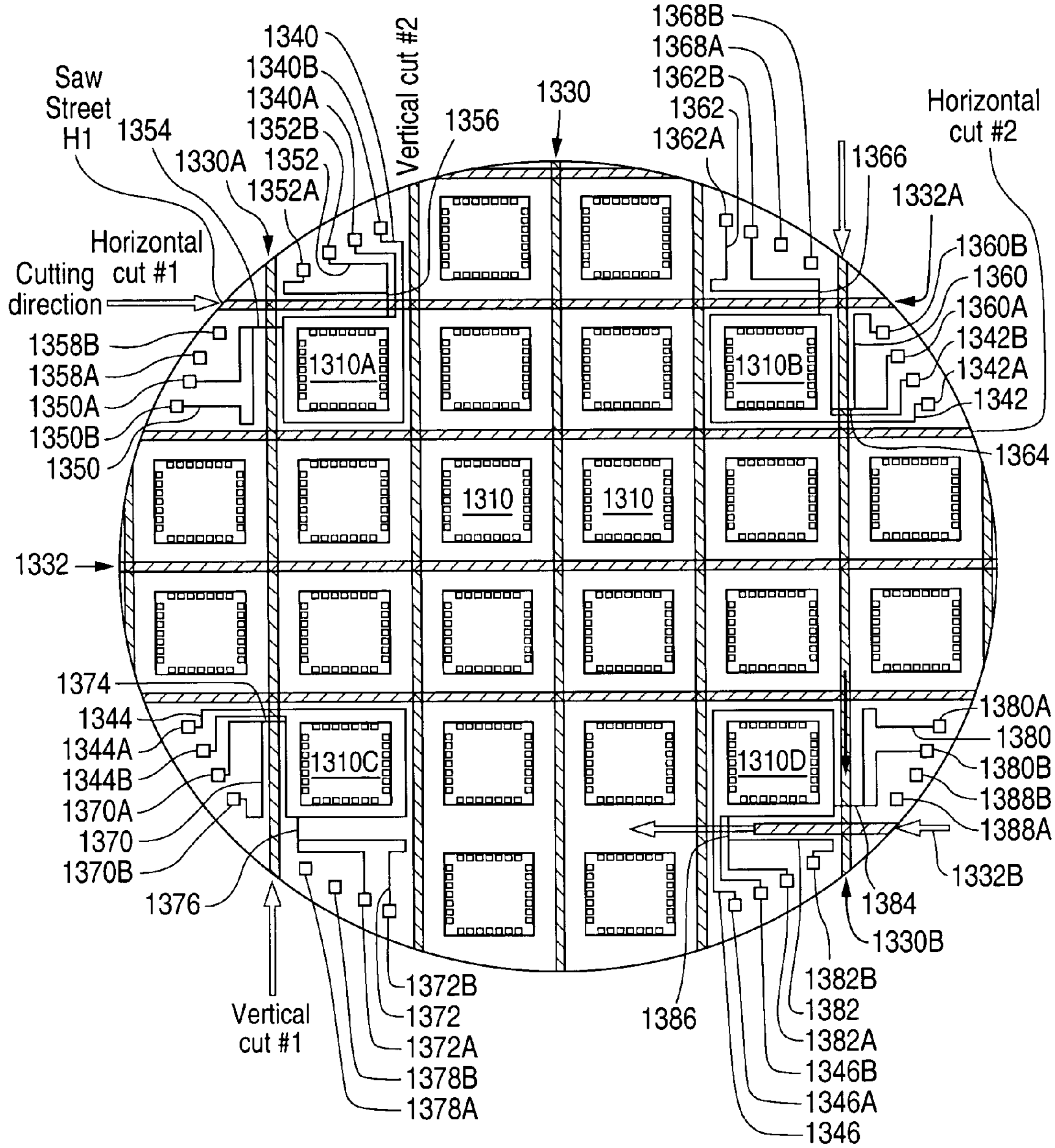

FIGS. 13A and 13B show plan views that illustrate an example of a resistance sensing semiconductor wafer 1300 in accordance with the present invention. FIG. 13A shows a metal level of wafer 1300, while FIG. 13B shows an overlying metal layer of wafer 1300. As shown in FIG. 13A, semiconductor wafer 1300 includes a number of semiconductor circuits 1310 that are formed in a square shape or a rectangular shape on wafer 1300.

Each semiconductor circuit 1310 has a pair of first sides 1312 that are parallel to each other, and a pair of second sides 1314 that are parallel to each other and perpendicular to the pair of first sides 1312. The pairs of first and second sides 1312 and 1314, in turn, define the outer periphery of the circuit.

In accordance with the present invention, wafer 1300 includes a metal trace 1320 that runs around the periphery of a circuit 1310A that sits in a first corner of wafer 1300, and a metal trace 1322 that runs around the periphery of a circuit 1310B that sits in a second corner of wafer 1300. Metal pads 1320A and 1320B are connected to the ends of metal trace 1320, and metal pads 1322A and 1322B are connected to the ends of metal trace 1322.

In addition, wafer 1300 includes a metal trace 1324 that runs around the periphery of a circuit 1310C that sits in a third corner of wafer 1300, and a metal trace 1326 that runs around the periphery of a circuit 1310D that sits in a fourth corner of wafer 1300. Metal pads 1324A and 1324B are connected to the ends of metal trace 1324, and metal pads 1326A and 1326B are connected to the ends of metal trace 1326.

As shown in FIG. 13B, wafer 1300 also includes a number of first saw streets 1330 that run parallel to the first sides 1312 between a number of circuits 1310, and between a number of circuits 1310 and the edge of wafer 1300. Wafer 1300 additionally includes a number of second saw streets 1332 that run parallel to the second sides 1314 between a number of circuits 1310, and between a number of circuits 1310 and the edge of wafer 1300. As shown, the first and second saw streets 1330 and 1332 are perpendicular to each other.

Further, wafer 1300 includes a metal trace 1340 that runs around the periphery of circuit 1310A that sits in the first corner of wafer 1300, and a metal trace 1342 that runs around the periphery of circuit 1310B that sits in the second corner of wafer 1300. Metal pads 1340A and 1340B are connected to the ends of metal trace 1340, and metal pads 1342A and 1342B are connected to the ends of metal trace 1342.

In addition, wafer 1300 includes a metal trace 1344 that runs around the periphery of circuit 1310C that sits in the third corner of wafer 1300, and a metal trace 1346 that runs around the periphery of circuit 1310D that sits in the fourth corner of wafer 1300. Metal pads 1344A and 1344B are connected to the ends of metal trace 1344, and metal pads 1346A and 1346B are connected to the ends of metal trace 1346.

Wafer 1300 also includes a metal trace 1350 that runs along one side of circuit 1310A on the opposite side of a saw street 1330A, and a metal trace 1352 that runs along another side of circuit 1310A on the opposite side of a saw street 1332A. Metal pads 1350A and 1350B are connected to the ends of metal trace 1350, and metal pads 1352A and 1352B are connected to the ends of metal trace 1352. A metal trace 1354 connects metal trace 1350 to metal trace 1340, and a metal trace 1356 connects metal trace 1352 to metal trace 1340. Further, metal pads 1358A and 1358B are connected to metal pads 1320A and 1320B, respectively, by vias.

Wafer 1300 also includes a metal trace 1360 that runs along one side of circuit 1310B on the opposite side of a saw street 1330B, and a metal trace 1362 that runs along another side of circuit 1310B on the opposite side of saw street 1332A. Metal pads 1360A and 1360B are connected to the ends of metal trace 1360, and metal pads 1362A and 1362B are connected to the ends of metal trace 1362. A metal trace 1364 connects metal trace 1360 to metal trace 1342, and a metal trace 1366 connects metal trace 1362 to metal trace 1342. Further, metal pads 1368A and 1368B are connected to metal pads 1322A and 1322B, respectively, by vias.

Wafer 1300 also includes a metal trace 1370 that runs along one side of circuit 1310C on the opposite side of saw street 1330A, and a metal trace 1372 that runs along another side of circuit 1310C on the opposite side of a saw street 1332B. Metal pads 1370A and 1370B are connected to the ends of metal trace 1370, and metal pads 1372A and 1372B are connected to the ends of metal trace 1372. A metal trace 1374 connects metal trace 1370 to metal trace 1344, and a metal trace 1376 connects metal trace 1372 to metal trace 1344. Further, metal pads 1378A and 1378B are connected to metal pads 1324A and 1324B, respectively, by vias.

Wafer 1300 also includes a metal trace 1380 that runs along one side of circuit 1310D on the opposite side of saw street 1330B, and a metal trace 1382 that runs along another side of circuit 1310D on the opposite side of saw street 1332B. Metal pads 1380A and 1380B are connected to the ends of metal trace 1380, and metal pads 1382A and 1382B are connected to the ends of metal trace 1382. A metal trace 1384 connects metal trace 1380 to metal trace 1346, and a metal trace 1386 connects metal trace 1382 to metal trace 1346. Further, metal pads 1388A and 1388B are connected to metal pads 1326A and 1326B, respectively, by vias.

Wafer 1300 can be cut by first cutting saw street 1332A in a left-to-right manner. The quality and the alignment of the cut can be monitored by probing contact pair 1352A and 1352B and contact pair 1340A and 1340B. When the cut severs metal trace 1356, the cut indicates that contact pair 1340A and 1340B are about to be cut. As a result, the monitoring will not be valid for a period of time after metal trace 1356 has been cut. Metal trace 1356 is monitored by continuously checking contact pair 1352B and 1340B.

The same process is repeated by monitoring contact pads 1362A and 1362B and contact pads 1368A and 1368B. The remaining horizontal streets are then cut, with saw street 1332B being the last monitored street to be cut. The last monitored street to be cut is cut in a right-to-left manner. Contact pads 1346A and 1346B and contact pads 1382A and 1382B are first monitored, then contact pads 1372A and 1372B and contact pads 1378A and 1378B are monitored as the cut nears the left side of wafer 1300.

Similarly, saw street 1330A is the first vertical street to be cut. Street 1330A is cut in a bottom to top manner. Contact pads 1344A and 1344B and contact pads 1370A and 1370B are first monitored, then contact pads 1350A and 1350B and contact pads 1358A and 1358B are monitored as the cut nears the left side of wafer 1300.

The remaining vertical streets are then cut, with saw street 1330B being the last monitored street to be cut. The last monitored street to be cut is cut in a top to bottom manner. Contact pads 1360A and 1360B and contact pads 1342A and 1342B are first monitored, then contact pads 1380A and 1380B and contact pads 1388A and 1388B are monitored as the cut nears the left side of wafer 1300.

Figure 14:
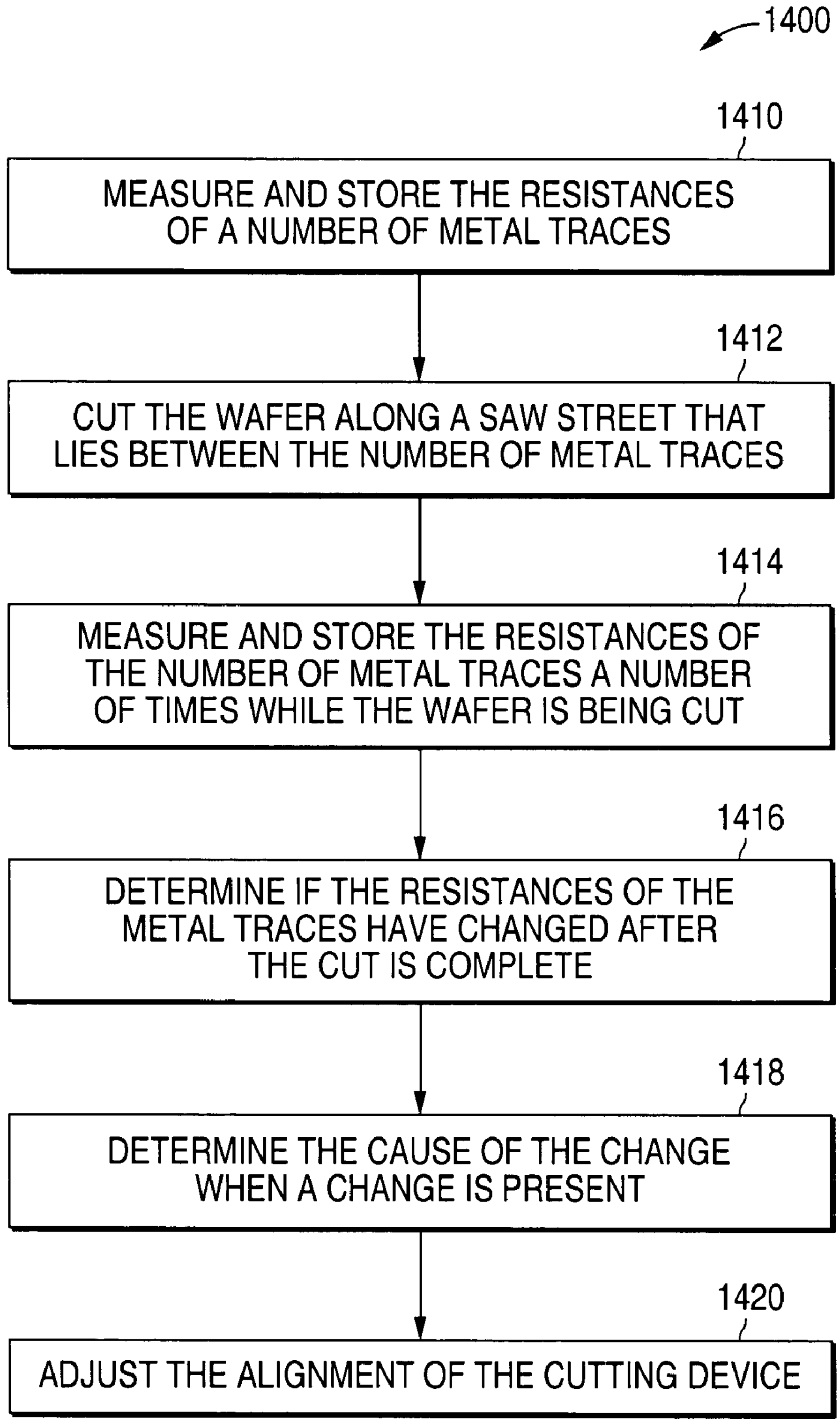
FIG. 14 is a flow chart illustrating an example of a method 1400 of cutting a wafer in accordance, with the present invention.
Figure 5:
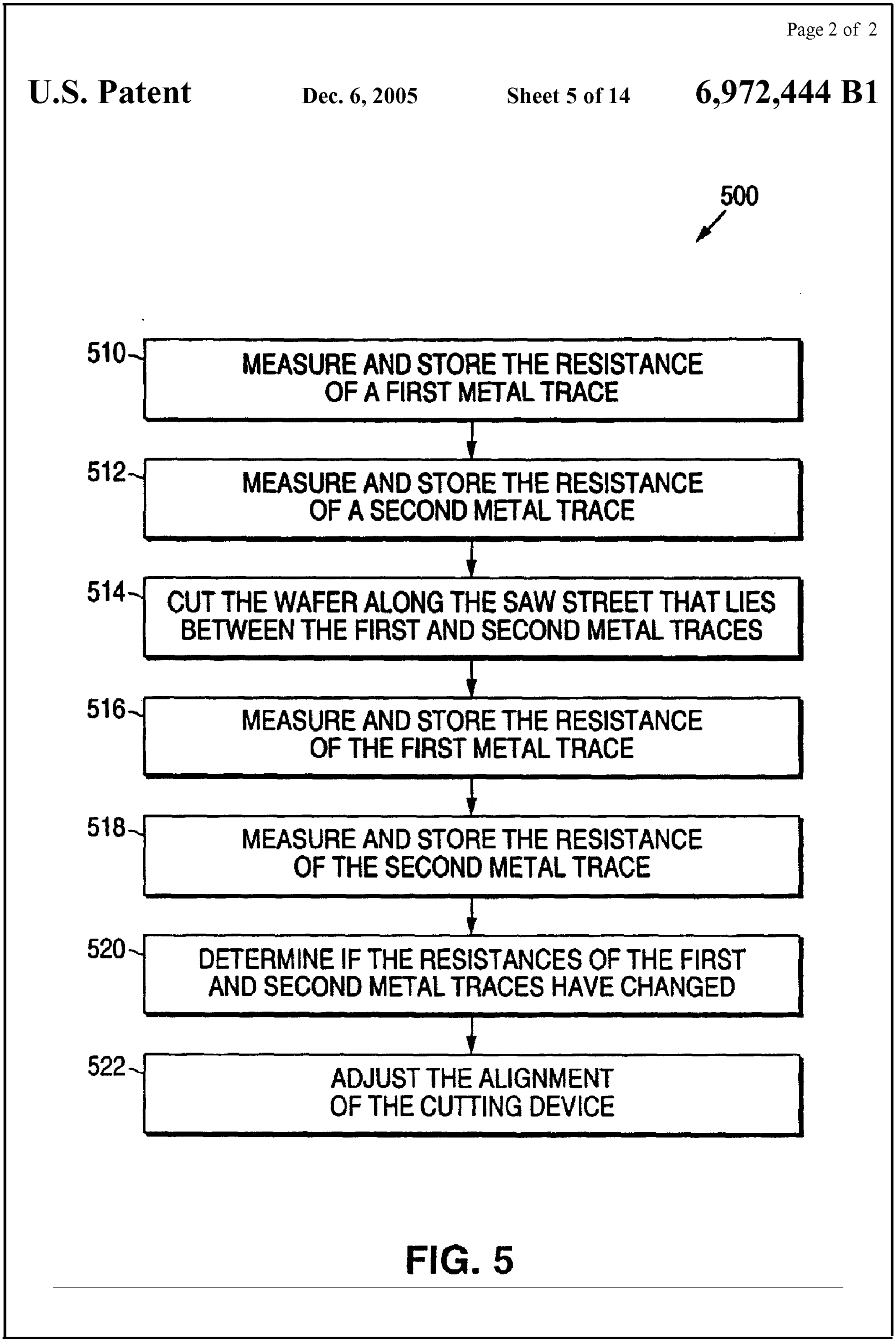

FIG. 14 shows a flow chart that illustrates an example of a method 1400 of cutting a wafer in accordance with the present invention. As shown in FIG. 14, method 1400 begins at step 1410 by measuring and storing the resistances of a number of metal traces, and then moves to step 1412 to cut the wafer along a saw street that lies between the number of metal traces.

Next, method 1400 moves to step 1414 to measure and store the resistances of the number of metal traces a number of times while the wafer is being cut. For example, controller 318 can cause multiplexers 312 and 314 to switch back and forth during the duration of the cut so that the resistances of metal traces 120 and 122 can be sampled a number of times during the cut. Thus, electrical contact is maintained with the wafer during wafer sawing.

When the cutting device is cutting the wafer, cooling water can be placed on the wafer (in any of the embodiments). If direct current (DC) is used to measure resistance while the cooling water is present, there is a potential for electrolysis. However, the potential for electrolysis can be eliminated by using alternating current (AC). Thus, the present invention allows continuous resistive measurements to be made without removing the cooling water (resistances can be measured even when the wafer is under water).

After the cut has been completed, method 1400 moves to step 1416 to determine if the resistances of the metal traces have changed (more than an error tolerance). When a problem is detected, the method outputs a maintenance signal that indicates that maintenance is required. In addition, when there has been a change in the resistance of the metal traces, method 1400 optionally moves to step 1418 to determine the cause of the change in resistance.

By taking resistance measurements during the cut, the cause of the change in resistance can be determined. For example, if the saw is misaligned and begins the cut at the center of the saw street, then the change in resistance will occur towards the end of the cut, effect only one of the metal traces, and cause the resistance to increase with each measurement once the trace is first cut. On the other hand, if the saw is aligned, begins at the center of the saw street, and needs service, then changes in the resistance will occur throughout the cut and can effect both metal traces.

When the cause of the change is misalignment, method 1400 optionally moves to step 1420 where method 1400 sends control signals to the saw controller to adjust the alignment of the cutting device. For example, system controller 318 and 418 can send control signals to saw controller 322 and 422, respectively, to adjust the alignment of cutting device 320 and 420, respectively. When the cutting device is properly aligned, the resistances of the metal traces, such as metal traces 120 and 122, will be equal (within an error tolerance).

One of the advantages of the present invention is that the present invention allows cutting tools to be used to nearly the maximum life of the cutting tool without processing wafer to detect a sawing problem. The present invention measures the resistances before and after the cut, and optionally during the cut, to detect cutting problems, thereby allowing the lifetime of the cutting tool to be monitored.

In the embodiments described above, the present invention is fabricated at the wafer level rather than the circuit level. For example, the metal traces that form the resistive sensor can be included in the reticle rather than each circuit that forms the reticle, which is stepped through the whole wafer. (A reticle is a set of n*m circuits that are located in the same optical mask, e.g., 2*3=6 devices are optically exposed together during the wafer photo-exposures. Reticles typically include test devices to monitor the process, and some of the resistive sensors can be included in the reticle structure.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A semiconductor wafer comprising:

a plurality of semiconductor circuits formed on the semiconductor wafer, each semiconductor circuit having a pair of first sides that are parallel to each other, and a pair of second sides that are parallel to each other and perpendicular to the pair of first sides;

a plurality of first saw streets that run parallel to the first sides between a number of the semiconductor circuits, each first saw street extending in a straight line from an edge of the wafer to another edge of the wafer;

a plurality of second saw streets that run parallel to the second sides between a number of the semiconductor circuits, each second saw street extending in a straight line from an edge of the wafer to another edge of the wafer;

a first metal trace formed between a first saw street and a first semiconductor circuit, the first metal trace being electrically isolated from each semiconductor circuit and not crossing the first saw street; and a second metal trace formed between the first saw street and a second semiconductor circuit, the second metal trace being electrically isolated from each semiconductor circuit and not crossing the first saw street, the first saw street lying between the first semiconductor circuit and the second semiconductor circuit.

2. The wafer of claim 1 wherein the first and second metal traces extend across the wafer.

3. The wafer of claim 1 wherein the first metal trace includes a first section and a second section that lie along side the first saw street, the second section having an extension section that extends away from the second section towards the first saw street.

4. The wafer of claim 3 wherein the second section has a plurality of extension sections that extend away from the second section towards the first saw street, each extension section having a first leg and a second leg that are connected together at a first end, and spaced apart and connected to the second section at a second end.

5. The wafer of claim 4 wherein the extension sections extend varying distances away from the second section towards the first saw street.

6. The wafer of claim 5 wherein an extension section extends into the first saw street.

7. The wafer of claim 4 and further comprising:

a reference element formed adjacent to the first and second sections;

a third metal trace that is connected to a first end of the resistive element; and a fourth metal trace that is connected to a second end of the resistive element.

8. The wafer of claim 7 wherein the reference element is a resistor.

9. The wafer of claim 3 and further comprising:

a third metal trace that lies between the first semiconductor circuit and the first saw street; and an extending section that extends away from the second section towards the first saw street, the extending section contacting the first metal trace and the third metal trace.

10. The wafer of claim 9 wherein the extending section extends into the first saw street.

11. The wafer of claim 1 wherein:

the first metal trace runs parallel to the first saw street and then turns and runs parallel to a second saw street; and the second metal trace runs parallel to the first saw street on an opposite side of the first saw street as the first metal trace, and then turns and runs parallel to the second saw street in an opposite direction as the first metal trace.

12. The wafer of claim 11 and further comprising:

a third metal trace that runs parallel to the first saw street and then turns and runs parallel to the second saw street on an opposite side of the second saw street as the first metal trace; and a fourth metal trace that runs parallel to the first saw street and then turns and runs parallel to the second saw street in an opposite direction as the third metal trace on an opposite side of the second saw street as the second metal trace.

13. The wafer of claim 12 and further comprising:

a fifth metal trace that runs parallel to a third saw street and then turns and runs parallel to a fourth saw street;

a sixth metal trace that runs parallel to the fifth metal trace along an opposite side of the third saw street and then turns and runs parallel to the fourth saw street in an opposite direction as the fifth metal trace, terminating at the first metal trace; and a seventh metal trace that runs parallel to portions of the fifth and sixth metal traces, terminating at the first metal trace.

14. The wafer of claim 1 wherein:

the first metal trace is formed around three sides and a portion of a fourth side of the first semiconductor circuit; and the second metal trace is formed around three sides and a portion of a fourth side of the second semiconductor circuit.

15. The wafer of claim 14 and further comprising a third metal trace formed around three sides and a portion of a fourth side of a third semiconductor circuit.

16. The wafer of claim 14 and further comprising a third metal trace formed around both the first semiconductor circuit and a third semiconductor circuit.

17. The wafer of claim 14 wherein the first and second metal traces are formed in a first level; and further comprising a third metal trace formed around three sides and a portion of a fourth side of the first semiconductor circuit, the third metal trace lying above and being spaced apart from the first metal trace.

* * * * *

UNITED STATES PATENT AND TRADEMARK OFFICE

CERTIFICATE OF CORRECTION

PATENT NO. : 6,972,444 B1
APPLICATION NO. : 10/635363
DATED : December 6, 2005
INVENTOR(S) : Iacob It is certified that error appears in the above-identified patent and that said Letters Patent is hereby corrected as shown below:

Title page, Item [54] and Column 1, line 1,
Title, delete “GUIDE”.

Delete drawing sheet FIG. 5 and insert replacement sheet FIG. 5.

Column 4,
Line 53, after “replaced” delete “;” and replace with -- , --.

Column 10,
Line 43, delete “10103” and replace with -- 1010J --.
Line 50, delete “110B” and replace with -- 1010B --.

Column 11,
Line 23, delete “110C” and replace with -- 1010C --.

Signed and Sealed this

Twentieth Day of June, 2006

JON W. DUDAS
*Director of the United States Patent and Trademark Office*